United States Patent [19]

Turner

[11] Patent Number: 4,490,681
[45] Date of Patent: Dec. 25, 1984

[54] SIGNAL LEVEL DETECTOR WITH AUTOMATIC SWITCHING BETWEEN EXTENDED LINEAR AND SQUARE LAW DYNAMIC RANGES

[75] Inventor: Roland J. Turner, Somerville, N.J.

[73] Assignee: AT&T Bell Laboratories, Murray Hill, N.J.

[21] Appl. No.: 348,917

[22] Filed: Feb. 16, 1982

[51] Int. Cl.³ .................. H03D 1/06; H03D 1/10
[52] U.S. Cl. ............................ 329/179; 329/178; 329/203; 329/204; 329/206; 307/354; 455/337
[58] Field of Search ............... 329/178, 179, 192, 203, 329/204, 205 R, 206; 455/337; 307/354, 362, 363; 328/150; 330/51, 106

[56] References Cited

U.S. PATENT DOCUMENTS 3,241,079  3/1966  Snell, Jr. ...................... 329/178 X
3,408,582  10/1968  Britton, Jr. ...................... 329/192
4,000,472  12/1976  Eastland et al. ...................... 329/204

OTHER PUBLICATIONS

Turner, R. J. "Schottky Diode Pair Makes an RF Detector Stable", *Electronics*, (May 2, 1974), pp. 94-95.
Clarke, K. K. et al., *Communication Circuits: Analysis and Design*, Addison Wesley Publishing Company, Reading, Mass., 1971, pp. 498-500.

*Primary Examiner*—Siegfried H. Grimm
*Assistant Examiner*—David C. Mis
*Attorney, Agent, or Firm*—C. S. Phelan

[57] ABSTRACT

A signal level detector including a diode envelope detector has a characteristic having both square-law and linear-law ranges separated by an intermediate transition range of variable-law operation. The detector is provided with circuits (38, 47, 48) to extend the linear-law range of the characteristic to overlap at least a part of the variable-law transition range. A circuit (66) is provided to detect operation through an input signal level transition point between said square-law range and the extended linear-law range for automatically modifying (39) the level detector circuit so that the voltage output thereof is continuously indicative of input power level through all of said ranges.

11 Claims, 3 Drawing Figures

SIGNAL LEVEL DETECTOR WITH AUTOMATIC SWITCHING BETWEEN EXTENDED LINEAR AND SQUARE LAW DYNAMIC RANGES

BACKGROUND OF THE INVENTION

This invention relates to a signal level detector employing diode circuits which are arranged to extend the continuous input signal range over which the detector can operate without user intervention to modify the detector circuits.

Signal level detectors often employ a diode envelope detector type of circuit. Such diode circuits are characterized by a limited dynamic range of input signals in which they can work, and they are highly sensitive to temperature variations. Many detector applications require a high degree of operating precision over a large signal range and in a wide temperature range necessitating complex and expensive measures to cope with the problems of temperature sensitivity and limited dynamic range of operation.

Diodes employed in such diode envelope detectors are often the so-called Schottky type of diode. These detector circuits are often divided according to two different types of operation. One is a low input signal, or square-law, detector in which the output voltage is a function of the square of the input voltage, or a function of the input power. Another type is the large signal, or linear-law, detector in which the output voltage is a function of the input voltage. The diode sensitivity to temperature variations is most severely evidenced in the square-law region of operation. It is known that diode detector circuits can be modified in order to alter either or both of the temperature sensitivity and the range of operation. In some cases, the circuit modifications must themselves be changed when the range of operation of the detector is to be altered. Consequently, envelope detectors which must operate under severe temperature conditions and over a large dynamic range of input signals, become quite complex and expensive.

An F. N. Eastland U.S. Pat. No. 4,000,472 shows an envelope detector with temperature compensation and having a bias voltage applied to the detector input to shift detector operation out of the nonlinear square-law region of operation. The temperature compensation is achieved by having a signal path extending through the envelope detector to one input of a voltage difference amplifier, and having a similar reference path including similar diodes extending to another input of the same difference amplifier. The difference voltage between the two paths is relatively less affected by temperature variations. A paper by R. J. Turner showing a similar temperature compensating technique and entitled "Schottky Diode Pair Makes an RF Detector Stable" is found in the May 2, 1974, issue of *Electronics* at pages 94 and 95.

One form of a current bias arrangement for an envelope detector diode is shown at pages 498–500 of *Communication Circuits: Analysis and Design*, by K. K. Clarke et al., Addison Wesley Publishing Company, Reading, Mass., 1971. A W. W. Snell, Jr. U.S. Pat. No. 3,241,079 shows a square-law detector having associated diodes for extending the square-law range of operation of the detector.

SUMMARY OF THE INVENTION

The foregoing difficulties in the operation of signal level detectors are substantially mitigated in a detector having both square-law and linear-law ranges of operation, and provided with circuits for extending the linear-law range of its operation for effectively overlapping at least a part of a variable-law transition range which is between the linear-law and square-law ranges.

In one embodiment of the invention, the linear-law range is extended to include input signal levels which are also included in the square-law range of operation of the same detector. Additional circuits are provided to detect transitions between the square-law range and the extended linear range for automatically modifying the signal level detection circuits, other than the envelope detector portions thereof, to accommodate the difference in the law of operation without user intervention.

BRIEF DESCRIPTION OF THE DRAWING

A more complete understanding of the invention and its various features, objects, and advantages may be obtained from a consideration of the following Detailed Description in connection with the appended claims and the attached drawing in which

DETAILED DESCRIPTION

Figure 1:
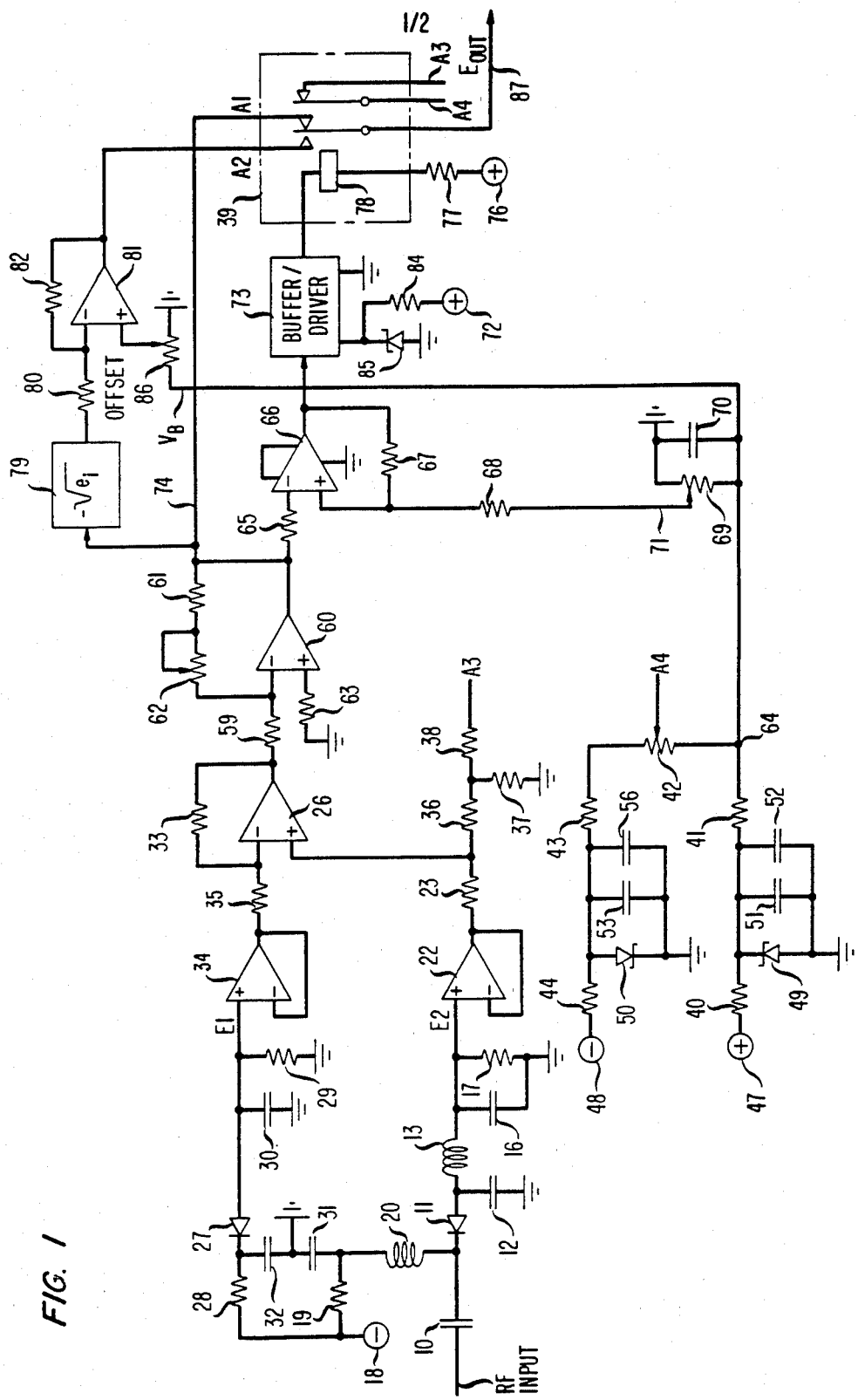
FIG. 1 is a schematic diagram of one embodiment of the invention.

In FIG. 1, the radio frequency (RF) input to the illustrated signal level detector is coupled through a series-connected capacitor 10 to a diode-type envelope detector. That detector illustratively includes a metal-semiconductor junction diode 11, such as a Schottky diode; but the invention is also useful in connection with other diodes, e.g., PN diffused junction diodes, also having a variable-law range of operation such as will be described in connection with FIG. 2. A low-pass filter for removing carrier frequency signal components includes a shunt-connected capacitor 12 and a series-connected coil 13. A so-called video load on the envelope detector comprises a shunt-connected capacitor 16 and shunt-connected resistor 17, across which the envelope detector output is developed.

Bias for diode 11 is supplied from a source of negative potential 18 schematically represented by a circled negative sign to indicate connection of the associated circuit to a suitable supply at the negative terminal thereof, and the positive terminal which is connected to ground. This schematic representation, using a circled polarity sign, is employed throughout the drawing to indicate operating potential supplies. A resistor 19 is connected from the source 18 in series with a radio frequency choke coil 20 to one terminal, the cathode in this case, of the diode 11. Resistances of resistors 17 and 19 are selected to provide a desired bias current level in the diode. The bias current level determines diode resistance and, therefore, the sensitivity for the diode. A relatively high bias current establishes a low zero-signal diode resistance and permits the employment of a relatively low envelope detector load resistance 17. The latter resistance affects the proportion of the total bias current circuit resistance which is assigned to the resistor 17. In the illustrative embodiment, a forward bias current of approximately 500 microamperes was provided from a minus 15-volt supply through a total of approximately 30,000 ohms of resistance in resistors 17 and 19. All or part of these 30,000 ohms may be included in resistor 17. In the example, approximately one-sixth of that total resistance is in the shunt resistor 17.

Figure 2:
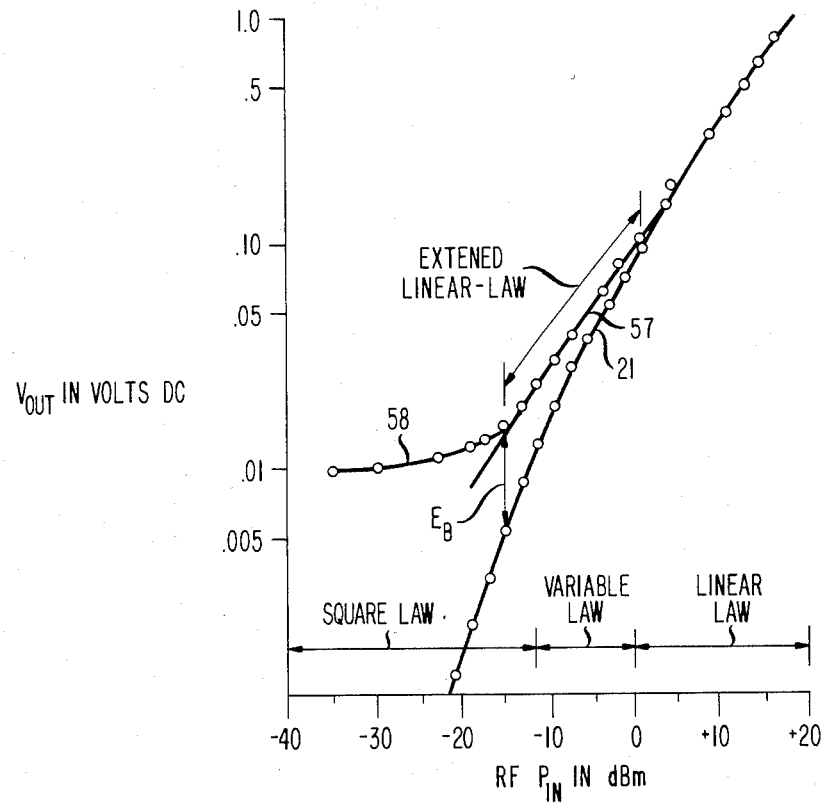
FIG. 2 contains characteristic curves for a signal level detector and illustrates the operation of the invention.

In FIG. 2, the curve 21 illustrates the operating characteristic of the envelope detector in terms of its temperature compensated output voltage (plotted on a logarithmic scale) versus RF input signal power $P_{IN}$ (plotted in dBm). That temperature compensated output is advantageously measured at the output of a difference amplifier 26 to be discussed. The various portions of the operating characteristic curve 21 in FIG. 2 are indicated along the lower portion of the drawing and show that the square-law region of operation extends from the lowest input signal levels up to approximately −12 dBm for the illustrative embodiment of a Schottky diode biased at approximately 500 microamperes. Next, the variable-law region extends from −12 dBm to approximately 0 dBm; and the linear-law region extends upward from the 0 dBm level.

Envelope detector output at E2 in FIG. 1 is applied to the noninverting input of a unity gain, operational, buffer amplifier 22 which is provided with a direct negative feedback connection to its inverting input connection. Amplifier 22 is otherwise biased and operated to respond to signals from the envelope detector by operating in a class A fashion in its linear range for all anticipated envelope detector output signals. Amplifier 22, and other operational amplifiers indicated herein, include in their schematic representation power supply and other connections known in the art for performing the functions indicated. A resistor 23 connects the output of amplifier 22 to the noninverting input of a unity gain voltage difference amplifier 26. The amplifier 22 isolates the impedance of the circuit of the envelope detector diode 11 from the impedance of other circuits on the output side of the amplifier so they do not figure significantly in the determination of the operating characteristics of the diode.

In order to reduce the temperature sensitivity of the envelope detector operation, a reference signal path is provided from the negative voltage supply 18 to the inverting input of amplifer 26 by way of a compensating diode 27. That diode 27 is advantageously matched to signal diode 11 at least in that the two are of the same type, and either are selected to have approximately the same operating characteristics, i.e., for a given diode current the voltage drops across the diodes are within ±5 millivolts of one another, or are manufactured in the same integrated circuit chip. Also, the diodes are advantageously mounted in a common thermal environment to increase the likelihood that their operating characteristic changes in response to temperature variations will track one another.

A resistor 28 is included in series in that reference path; and a resistor 29 is connected in shunt with the path on the opposite side of the diode 27 to provide, with a capacitor 30, the aforementioned video load on the reference diode 27. Resistors 28 and 29 are of the same magnitudes as the aforementioned resistors 19 and 17, respectively. A pair of capacitors 31 and 32 are connected to shunt from the two paths, respectively, to ground any RF signal components that may leak back from the diodes. Diodes 11 and 27 are connected to conduct the aforementioned bias currents in the forward direction of operation of each diode. The direct current reference signal at E1 from the reference diode path is applied to the noninverting input of a unity gain amplifier 34 which is of the same type and connected in essentially the same manner as the amplifier 22. An output of amplifier 34 is applied through a resistor 35 to the inverting input of difference amplifier 26.

A negative feedback resistor 33 is connected around the amplifier 26 and has a resistance the same as that of the resistor 35 in order to fix the inverting input signal gain through the difference amplifier 26 at the unity gain level. The noninverting input of amplifier 26 is connected to ground through a series combination of resistors 36 and 37. Resistor 36 is of approximately the same resistance as resistor 23 in order to assure a unity gain level of operation for the noninverting input signals to difference amplifier 26. The resistance of resistor 37 is approximately two orders of magnitude smaller than that of resistor 36 in order to develop a voltage difference with respect to ground that is significant but does not significantly distort the unity gain mode of operation of amplifier 26.

It can be seen from the foregoing that the diodes 11 and 27 have matched capabilities. They also have substantially the same current bias, e.g., at approximately 500 microamperes; and they have matched load resistors 17 and 29. The presence of coils 13 and 20 and shunt capacitor 12 in only the signal envelope detector path does not represent a significant mismatch, because those reactive elements do not contribute significantly to the direct current level of circuit operation.

Up to this point, the signal level detector of FIG. 1 operates in accordance with the curve 21 in FIG. 2 with the indicated three regions of operation in accordance with different laws as is characteristic of Schottky diodes. It has been found that by applying an appropriate offset voltage bias to the envelope detector path output, e.g., to the noninverting input of amplifier 26, the effective linear-law range of envelope detector operation is extended into lower input signal regions of the characteristic through at least a part of the variable-law range. This extension of the linear-law portion of the diode characteristic is advantageously made to overlap at least the full variable-law, transition region between the square-law and linear-law regions of FIG. 2. This makes it possible, by arrangements which will be described, to have continuous small-signal and large-signal operation of the overall level detector without modification of the envelope detector circuit to account for the intermediate variable-law range of the diode 11 characteristic.

The amount of offset bias required at the noninverting input to amplifier 26 is approximately the voltage difference between a straight-line extension 57 of the linear-law characteristic portion of curve 21 and the intermediate variable-law characteristic portion of curve 21 without the mentioned offset bias. It has been found that if one measures in FIG. 2 the difference between those two characteristic portions at the upper end of the square-law region of the characteristic, e.g., at approximately −15 dBm of input RF signal, and for the illustrative arrangement in which the diodes 11 and 27 are each biased by about 500 microamperes of current, the difference $E_B$ is approximately 9 millivolts. Furthermore, as can be seen in the FIG. 2, approximately that same difference prevails between those two characteristics all the way through the variable-law region to the lower end of the natural linear-law region of the envelope detector operation. The apparent convergence of the two characteristic portions in FIG. 2 is a result of the logarithmic scale used for plotting output voltage. The difference prevails, of course, up into the linear-law region; but, in that region, the output voltage of the envelope detector is so large compared to that difference that the offset is negligible.

The aforementioned offset bias voltage $E_B$ is advantageously applied through a resistor 38 to the common circuit terminal between the series connected resistors 36 and 37. This bias should be supplied from a stabilized voltage supply and; in FIG. 1, it is so provided through connection points A3 and A4, and through a switch 39, to be described, by means of which the offset bias can be controllably applied to and removed from the circuits of amplifier 26. In the illustrative embodiment, the stabilized voltage supply is provided from a combination of potential dividing resistors 40 through 44 connected in series between a positive voltage supply 47 and a negative voltage supply 48. Resistors 40 and 44 are current dropping resistors and are connected in series with reverse breakdown diodes 49 and 50, respectively, to ground. The diodes are poled to provide reverse conduction of current with respect to their associated potential sources 47 and 48, respectively. The resistances of resistors 40 and 44 are selected to establish current bias in the respective diodes 49 and 50 at their optimum points for good temperature tracking characteristics, i.e., minimum sensitivity to temperature variations. Capacitors 51 and 52 are connected in parallel with diode 49 to bypass thereabout any alternating current components which may find their way back to this bias supply from the envelope detector circuits. Capacitors 53 and 56 are connected around the diode 50 to perform a similar bypass function for that diode.

Resistors 41, 42, and 43 are connected in series between the cathode of diode 49 and the anode of diode 50 to provide a convenient voltage tapping point for connection of resistor 38, through the switch 39, to a reference voltage point which is close to the zero voltage level with respect to ground. That point is advantageously positive with respect to ground in the illustrative embodiment to shift operation from the variable-law portion of curve 21 in FIG. 2 to the extended linear-law line 57. The employment of two supply circuits with the two diodes 49 and 50, instead of just one, provides greater temperature stability for the bias circuit.

When switch 39 is operated to connect resistor 38 to the tapping point on resistor 42, the offset bias $E_B$ is applied to amplifier 26. It has been found under those circumstances that the envelope detector then operates in accordance with the extended linear-law characteristic portion 57 illustrated in FIG. 2, rather than on the adjacent variable-law portion of the characteristic curve 21 in response to RF input signals in the range from −15 dBm up through 0 dBm. For input signals below the −15 dBm level, the operation with offset bias $E_B$ produces the upwardly sweeping characteristic portion 58 in FIG. 2. However, operation in that portion 58 is advantageously avoided in accordance with another aspect of the present invention by switchably modifying the signal level detector circuits, other than the envelope detector portions thereof, to transfer between the square-law portion and the extended linear-law region as input signal variations pass in either direction through the −15 dBm point of the illustrated characteristic. One possible arrangement for this switchable modification will now be described in connection with the remaining portion of FIG. 1.

The output of voltage difference amplifier 26 is applied through a resistor 59 to the inverting input connection of an operational amplifier 60 which has a resistive negative feedback connection including resistors 61 and 62 connected in series in that connection. The resistances assigned to resistor 59, and the series combination of resistors 61 and 62, are selected to produce a nominal gain of approximately 20 dB through the amplifier. This gain is provided to recover some of the level detector voltage sensitivity normally lost in an envelope detector circuit which is biased at a relatively high current level as hereinbefore described for the diodes 11 and 27. If a smaller current bias is employed in the envelope detector, a larger resistance must be used for load resistor 17, to maintain its resistance much larger than that of diode 11; and less gain is required in amplifier 60 to maintain a desired level of detector voltage sensitivity. A resistor 63 is connected between the noninverting input of amplifier 60 and ground and has a resistance which is approximately equal to the combination of resistor 59 in parallel with the series combination of resistors 61 and 62. Since the resistance of resistor 59 must dominate the combination resistance of that parallel combination in order to provide the 20 dB of gain, resistor 63 has approximately the same resistance as resistor 59.

Output from amplifier 60 is coupled through a resistor 65 to the inverting input of an operational amplifier comparator 66. This comparator has a resistive positive feedback connection to the noninverting input thereof through a resistor 67. That same noninverting input of comparator 66 is coupled through a resistor 68 to a tap 71 on a potentiometer resistor 69 that is connected between ground and the positive potential end, terminal 64, of resistor 42 in the supply circuit for the offset bias $E_B$. In order to keep comparator hysteresis low, it is advantageous to assign resistor 67 a value which, when divided by the open loop gain of amplifier 66, is approximately the same as the sum of the resistance of resistor 68 and the resistance to ground from the tap 71. A bypass capacitor 70 is connected in parallel with resistor 69. The tap 71 on resistor 69 is advantageously adjusted so that when the RF input to the illustrated signal level detector is at the aforementioned −15 dBm point, and the inverting input connection signal to comparator 66 is slightly greater than the threshold bias signal at the noninverting input, the output of comparator 66 shifts from a positive signal with respect to ground to a zero signal. That signal shift indicates the positive-going transition of the input signal through the −15 dBm point. The resistance of resistor 69 is made substantially larger than the combined resistances in the aforementioned offset bias supply circuits between terminal 64 and ground so that the presence of the resistor 69 does not adversely affect the establishment of the described offset bias voltage.

A negative-going transition through the same −15 dBm point would produce a positive-going voltage step of the same magnitude in the output of the comparator 66. Those output signals are applied to an inverter buffer/driver circuit 73, of a type which is well known in the art, to respond to such a voltage step for generating a current of sufficient magnitude to operate a relay-type switch such as the switch 39. One such buffer/driver is either the 41BS buffer/driver circuit manufactured by the Western Electric Company or the 7407 buffer and interface gates with open collector outputs manufactured by Texas Instruments, Inc. A stabilized voltage bias for the buffer/driver is provided from a series combination of a resistor 84 and a reverse breakdown diode 85 connected in series across a positive voltage supply 72.

Switch 39 is a relay-operated, double-pole, double-throw switch with a low, temperature-stable, closed-circuit resistance, e.g., about 0.1 ohm. The buffer/-driver 73 controls the flow of current from a positive voltage supply 76 through a current limiting resistor 77 and an operating coil 78 of the relay-type switch 39. The latter switch is controlled by the buffer/driver 73 to close the circuit between its connections $A_3$ and $A_4$ in response to detector input signals greater than $-15$ dBm, and to open that circuit in response to input signals less than $-15$ dBm. Thus, the bias voltage $E_B$ is provided to the voltage difference amplifier 26 for only those larger signals above the $-15$ dBm level.

Switch 39 also has two additional connections $A_1$ and $A_2$. The connection $A_1$ is directly coupled to the output of amplifier 60. The connection $A_2$ is coupled to that same amplifier output through a series combination of a square rooting circuit 79, a resistor 80, and a unity gain, operational amplifier 81 having a resistive negative feedback connection to its inverting input connection through a resistor 82. An offset bias is provided to the noninverting input of amplifier 81 from a positive voltage connection $V_B$ (i.e., terminal 64) by way of a tap on a voltage dividing resistor 86.

It can be seen in FIG. 2 that the square-law portion of the envelope detector characteristic has a slope of two, whereas the linear-law portion has a slope of approximately one. Accordingly, the square rooting circuit 79 is utilized in the square-law range of operation to take the square root of the signal from amplifier 60 in order that the overall signal level detector circuit output will have the same meaning, i.e., output volts, in both the square-law range and the linear-law ranges of envelope detector operation. However, the result of taking the square root produces a characteristic with approximately one-half the slope of the normal square-law output signal; and amplifier 81, with its aforementioned offset bias, is provided to shift the output of the square root circuit 79 up by an amount sufficient to produce collinear operation with respect to the extended linear-law portion of the detector circuit.

The square rooting circuit 79 is advantageously a 4213 multiplier-divider of the Burr-Brown Research Corp. and connected for square root operation, e.g., as suggested in application notes in the manufacturer's "1979 General Catalog." Thus, in FIG. 1, when the signal level detector is operating in its low signal, or square-law, range, no offset bias is applied to amplifier 26; but the output of amplifier 60 is coupled through the square rooter 79, amplifier 81, and switch 39 to the level detector output lead 87. Otherwise, for signals $> -15$ dBm, the offset bias is applied to the difference amplifier 26; and the output of amplifier 60 is coupled through the lead 74 and switch 39 to the level detector output lead 87. The result of operation of buffer/driver 73 and switch 39 is to produce on lead 87 an output voltage that is continuously indicative on the same dimensional basis of input power levels in all of the square-low, extended-linear-law, and linear-law ranges.

Figure 3:
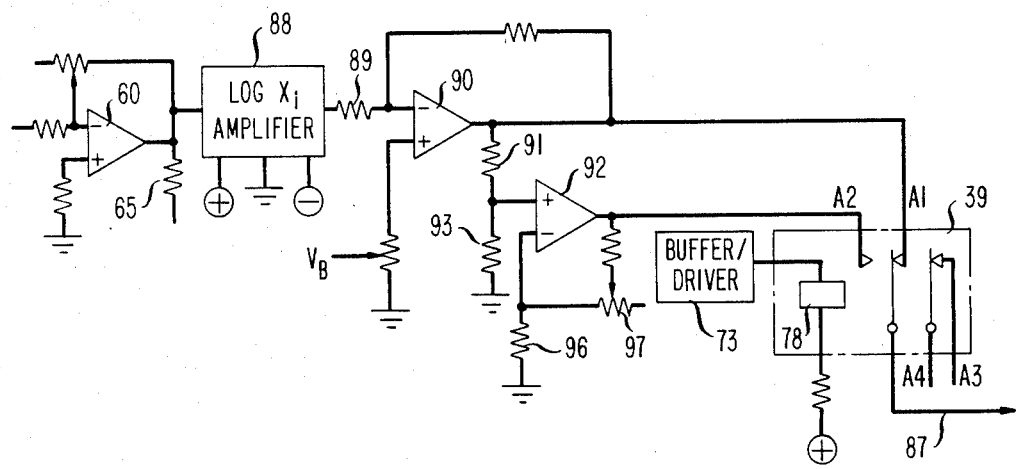
FIG. 3 is a schematic diagram of a modified portion of the signal level detector of FIG. 1.

FIG. 3 is an illustration of a modified portion of the circuit of FIG. 1, i.e., that portion relating to the control of the switch 39 and to the manner of providing the output of amplifier 60 to the level detector output lead 87. In this case, the level detector through amplifier 60, the comparator 66, buffer/driver 73, and switch 39 are the same as described in connection with FIG. 1. Likewise, the switch 39 control of the connection of the offset bias $E_B$ is the same. In this case, however, the output of the amplifier 60 is for all input signal situations applied through a logging amplifier 88, a coupling resistor 89, and a unity gain amplifier 90 to the $A_1$ connection of switch 39. Amplifier 88 is, e.g., an Analog Devices Corp. AD759N wide band log/antilog amplifier. The use of a log amplifier for both linear and square-law operation makes it possible to place the detector outputs for both cases on the same basis by simply adding a slope control during square-law operation as will be described. Amplifier 90 performs the same function as previously described for amplifier 81 in connection with FIG. 1.

In response to input signals below $-15$ dBm, switch 39 connects the detector output lead 87 to the connection $A_2$, which receives signals from the output of amplifier 90 by way of a resistor 91 and a further operational amplifier 92 having a negative feedback connection including a variable resistor 97 to the inverting input connection thereof and including a resistor 96 to ground. The noninverting input connection is coupled to ground through a further resistor 93 having a resistance selected in proportion to the resistance of resistor 91 to provide a gain of one-half through amplifier 92 for signals at the output port of amplifier 90. That gain serves to convert the square-law region characteristic slope to unity. The adjustable feedback resistance 97 provides a fine control on the slope of the level detector characteristic so that in the low, or square-law, region, the slope will be the same as the slope at connection $A_1$ when operating in the linear range. Thus, the output voltage appearing on the lead 87 is still similarly indicative of the RF signal level applied to the input of the level detector in both the square-law and linear-law (extended and natural) ranges of operation.

It is noted in FIG. 2 that the illustrated envelope detector operates over about three orders of output voltage magnitudes and an additional decade for smaller signals not shown in the drawing. Such a wide range is sometimes inconvenient to handle, e.g., in analog meters. However, the circuits described in connection with FIGS. 1 and 3 for automatically switching offset bias and switching treatment of amplifier 60 output have the additional benefit of compressing the detected amplitude information in the square-law region of operation into somewhat more than one decade of output voltage amplitude range for easier handling by utilization circuits such as analog meters.

Although the invention has been described in connection with particular embodiments and a particular application thereof, it is to be understood that additional embodiments, applications, and modifications which will be obvious to those skilled in the art are included within the spirit and scope of the invention.

What is claimed is:

1. A signal level detector including a circuit having both linear-law and square-law ranges of operation and an intermediate variable-law range of operation and comprising means for extending the linear-law range of said detector to overlap at least a portion of said intermediate variable-law range, said extending means comprising means for biasing output signals of said detector during at least said variable-law range of operation to levels corresponding approximately to an extrapolation of said linear-law range of operation.

2. A signal level detector including a circuit having both linear-law and square-law ranges of operation and an intermediate variable-law range of operation and comprising means for extending the linear-law range of said detector to overlap at least a portion of said intermediate variable-law range, and
   means for amplitude compressing output signals of said detector.

3. A signal level detector including a circuit having both linear-law and square-law ranges of operation and an intermediate variable-law range of operation and comprising means for extending the linear-law range of said detector to overlap at least a portion of said intermediate variable-law range,
   a voltage difference amplifier,
   an envelope detecting signal path circuit electrically connected between an RF signal input connection of said level detector and a first input of said amplifier,
   means for biasing at least a portion of said envelope detecting signal path circuit to a predetermined nominal operating point, and
   a temperature compensating reference current path circuit electrically connected between said biasing means and a second input of said amplifier.

4. A signal level detector including a circuit having both linear-law and square-law ranges of operation and an intermediate variable-law range of operation and comprising means for extending the linear-law range of said detector to overlap at least a portion of said intermediate variable-law range,
   an envelope detecting signal path circuit electrically connected for coupling level detector input signals to said extending means and including a diode connected in an envelope detecting circuit, said diode having an input power versus output voltage characteristic including a low signal range represented by said square-law range, a high signal range represented by said linear-law range, and an intermediate signal range of variable-law operation, and
   means, in said extending means, for biasing an output of said envelope detecting signal path circuit by an amount corresponding approximately to the voltage difference between corresponding input power points in said variable-law range of said characteristic and a linear extrapolation of said linear-law range of said characteristic through an input signal range including said variable-law range.

5. The detector in accordance with claim 4 which comprises in addition means in said envelope detecting signal path circuit for isolating the output impedance of said envelope detecting circuit from the impedance of said biasing means.

6. The detector in accordance with claim 4 in which there are provided means, including a current source having a predetermined resistance, for current biasing said diode in said envelope detecting signal path circuit, and
   means for connecting only a portion of the resistance of said current source to load said envelope detecting circuit, said resistance portion being much larger than the conducting resistance of said diode.

7. The signal level detector in accordance with claim 4 which comprises, in addition means for indicating when an output from said envelope detecting signal path circuit corresponds to a predetermined level detector input signal level at the low input signal end of said linear-law range extrapolation,
   means, responsive to an output of said indicating means for input signals below said predetermined level, for disabling said envelope detecting signal path circuit output biasing means, and
   means, responsive to said output of said indicating means for input signals below said predetermined level, for translating output signals of said envelope detecting signal path circuit to levels indicative of corresponding detector input signal power level on the same dimensional basis as envelope detecting signal path circuit output signals in said linear-law range of operation.

8. The signal level detector in accordance with claim 8 in which said translating means includes means for amplitude compressing said output signals of said envelope detecting signal path circuit.

9. The signal level detector in accordance with claim 7 in which said translating means comprises means for setting of said level detector square-law range characteristic portion to be collinear with said linear-law range characteristic portion.

10. The signal level detector in accordance with claim 7 in which said translating means comprises means for producing signals corresponding to the square root of output signals, respectively, of said envelope detecting signal path circuit.

11. The signal level detector in accordance with claim 7 in which means are provided for producing signals corresponding to the logarithm of output signals, respectively, of said envelope detecting signal path circuit, and
    said translating means comprises means, responsive to said producing means, for setting said level detector square-law range characteristic portion to be collinear with said linear-law range characteristic portion.

* * * * *